US005082083A

United States Patent [19]

Draffen

[11] Patent Number: 5,082,083

[45] Date of Patent: Jan. 21, 1992

[54] STRUCTURE WALL MOUNTED SPEAKER ASSEMBLY

[75] Inventor: Gary T. Draffen, Rancho Palos Verdes, Calif.

[73] Assignee: Culver Electronic Sales, Inc., Gardena, Calif.

[21] Appl. No.: 591,946

[22] Filed: Oct. 2, 1990

[51] Int. Cl.[5] .................. H05K 5/00

[52] U.S. Cl. .................. 181/150; 181/199

[58] Field of Search .................. 181/144-156, 181/199

[56] References Cited

U.S. PATENT DOCUMENTS 4,296,280 10/1981 Richie .................. 181/150 X 4,640,381 2/1987 Tsuchiya et al. .................. 181/144

*Primary Examiner*—Brian W. Brown

*Assistant Examiner*—Khanh Dang

*Attorney, Agent, or Firm*—Thomas I. Rozsa

[57] ABSTRACT

An easy to install wall mounted stereo speaker assembly wherein the woofer of the speaker is mounted in the assembly wall frame and the tweeter is both mounted in and self contained within the assembly wall frame. The easy installation requires only that a circular opening be cut in the wall to enable the rear portion of the woofer to extend through the dry wall or sheetrock and two simple holes drilled in the wall to accommodate the support bolts to retain the wall mounted speaker assembly on the wall.

19 Claims, 1 Drawing Sheet

Fig. 1.
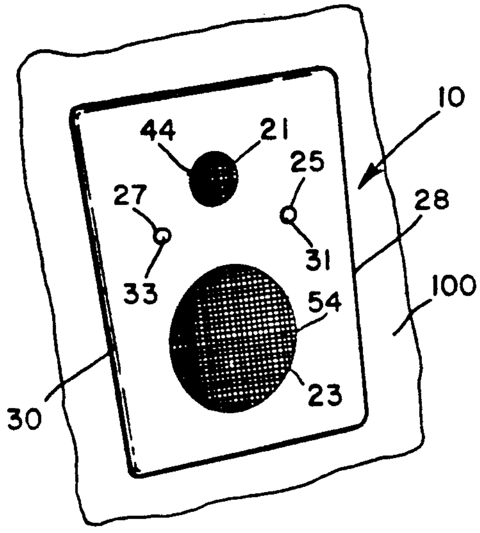
Fig. 2.
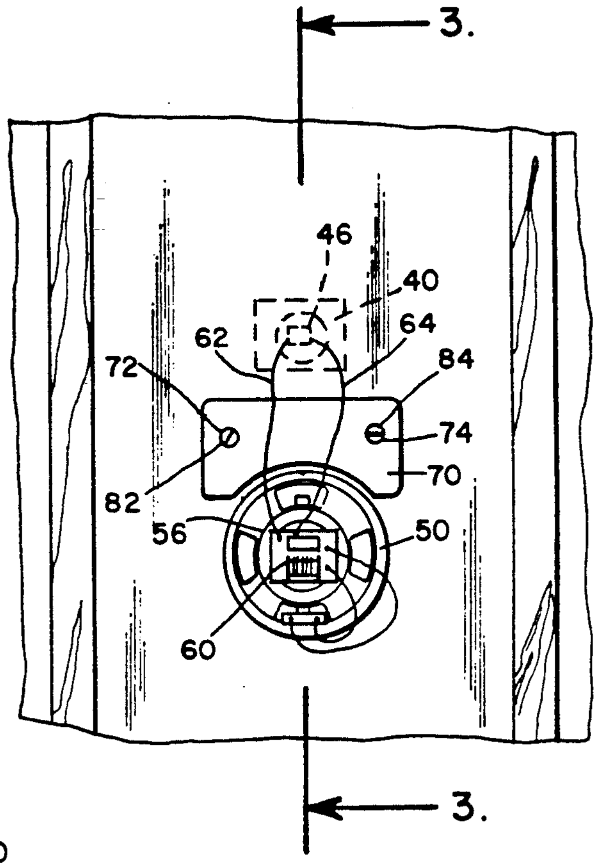
Fig. 3.
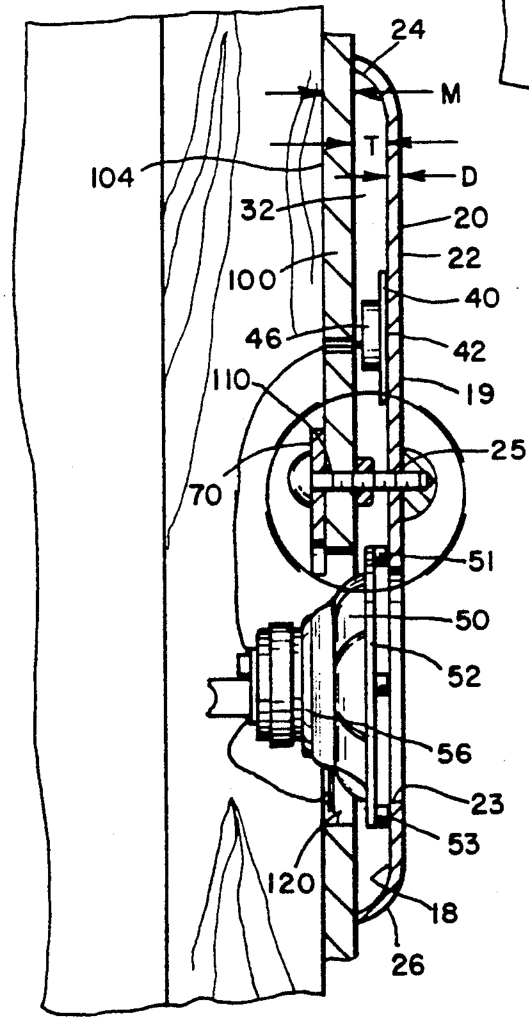
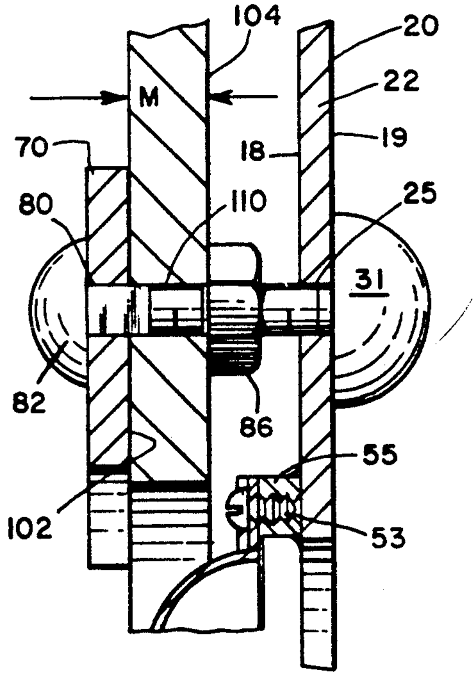
Fig. 4.

STRUCTURE WALL MOUNTED SPEAKER ASSEMBLY

BACKGROUND OF THE INVENTION

1. Field of the Invention

The present invention relates to the field of stereo speaker systems. In particular, the present invention relates to the specialized area of wall mounted stereo speaker assemblies which enable the entire speaker assembly to be mounted in the wall of a structure and thereby eliminate the necessity of having a bulky stereo speaker occupying floor space. The present invention further relates to simple self installation assemblies which can be quickly and easily installed by the home owner without requiring a specialist in custom stereo speakers to install the unit in the wall.

2. Description of the Prior Art

In general, wall mounted stereo speaker assemblies have been known in the prior art. Representative examples of prior art wall mounted stereo speaker assemblies are produced by Niles Audio Corporation and by Boston Acoustics. The major drawback with prior art wall mounted stereo speaker assemblies is that they are complex in design and require a specialist to install such unit in the wall. The assembly requires that an extensive opening be cut in the dry wall or sheetrock wall in which the stereo speaker is to be installed. A special frame must then be constructed which is supported by the wood framing of the home, such as 2×4 wood beams. After the specialized frame is constructed, the stereo speaker must then be specially mounted in the newly constructed support frame. While the end result is a satisfactory product, the design and installation requirements of prior art wall mounted assemblies require the owner to hire expensive specialists to custom build and design the support structure and to specially build the wall mounted stereo into the wall of the building. Such installation is both time consuming and expensive and therefore substantially limits the number of consumers who are willing to acquire such a system.

There is a significant need for a simplified wall mounted stereo system which enables the home owner to quickly, inexpensively, and efficiently install the stereo speaker assembly in the wall of any structure.

SUMMARY OF THE PRESENT INVENTION

The present invention relates to an easy to install structure wall mounted stereo speaker assembly wherein the woofer of the speaker is mounted in the assembly wall frame and the tweeter is both mounted in and self contained within the assembly wall frame. The easy installation requires only that a circular opening be cut in the wall to enable the rear portion of the woofer to extend through the dry wall or sheetrock and two simple holes drilled in the wall to accommodate the support bolts to retain the wall mounted speaker assembly on the wall.

A common speaker assembly has two major operating components. The first component is a tweeter which is a small loudspeaker responsive only to the higher acoustic frequencies and reproducing sounds of high pitch. The second component is a woofer which is a loudspeaker, usually larger than a tweeter, responsive only to the lower acoustic frequencies, and used for reproducing sounds of low pitch. It has been discovered, according to the present invention, that if a woofer and a tweeter of a stereo speaker are mounted in a support frame such that the entire thickness of the tweeter lies within the support frame while only a portion of the woofer extends beyond the thickness of the frame, then the support frame can be quickly mounted on the dry wall or sheetrock of a structure with only a requirement for drilling one large hole in the dry wall or sheetrock to accommodate the rear portion of the woofer which extends beyond the thickness of the support frame.

It has further been discovered, according to the present invention, that a support frame for a wall mounted stereo speaker can be supported on the dry wall or sheetrock of a structure by having two bolts which extend through the dry wall or sheetrock to anchor the stereo speaker support frame to the wall. A support back plate and nut assembly serve to securely anchor the two spaced apart bolts to the dry wall or sheetrock. Therefore, it has been discovered that it is not necessary to cut a large opening in the wall and construct a specialized frame which is attached to the framing wood beams of the structure in order to securely and safely attach the speaker assembly to the structure wall.

It has additionally been discovered, according to the present invention, that the single opening in the dry wall or sheetrock provides sufficient clearance for the vibrating woofer and avoids any problem of the woofer vibration impairing the integrity of the dry wall or sheetrock. Furthermore, having a tweeter whose thickness lies within the support frame of the assembly eliminates the problem of the tweeter vibrating into and impairing the integrity of the dry wall or sheetrock.

It is therefore an object of the present invention to provide a wall mounted speaker assembly which is a self contained unit requiring only a minimal effort to install.

It is a further object of the present invention to provide a wall mounted speaker assembly which can be easily installed by a home owner without requiring a professional to install the speaker.

It is an additional object of the present invention to provide a wall mounted speaker assembly which can be supported by attaching means which anchor the speaker frame to the dry wall or sheetrock without requiring the construction of a special frame anchored to the framing beams of the structure.

Further novel features and other objects of the present invention will become apparent from the following detailed description, discussion and the appended claims, taken in conjunction with the drawings.

BRIEF DESCRIPTION OF THE DRAWINGS

Referring particularly to the drawings for the purpose of illustration only and not limitation, there is illustrated:

FIG. 1 is a perspective view of the present invention wall mounted speaker assembly in its final operative position mounted on the dry wall or sheetrock of a structure.

FIG 2 is a rear elevational view of the present invention wall mounted speaker assembly mounted onto the dry wall or sheetrock of a structure.

FIG. 3 is a cross-sectional view taken along line 3—3 of FIG. 2

FIG. 4 is an enlarged view as encircled in FIG. 3 of one of the mounting means for mounting the wall speaker onto the wall of a structure.

DETAILED DESCRIPTION OF THE PREFERRED EMBODIMENT

Although specific embodiments of the invention will now be described with reference to the drawings, it should be understood that such embodiments are by way of example only and merely illustrative of but a small number of the many possible specific embodiments which can represent applications of the principles of the invention. Various changes and modifications obvious to one skilled in the art to which the invention pertains are deemed to be within the spirit, scope and contemplation of the invention as further defined in the appended claims.

Referring particularly to FIG. 1, there is shown at 10 the present invention wall mounted speaker assembly affixed to an interior wall 100 of a structure such as a home or office. When viewed from the front, all that is visible is the decorative face of the speaker frame 20, the front grill 54 of woofer 50, the front grill 44 of tweeter 40, and the decorative covering nuts 31 and 33 of the support means which anchor the wall speaker 10 to the wall 100 such as dry wall or sheetrock.

The detailed structure of the present invention wall mounted speaker 10 is illustrated in FIGS. 2 through 4. The wall mounted speaker 10 comprises a support frame 20 which has a generally flat panel 22 which is rounded along its upper and lower edges and its sidewalls to form arcuate upper edge 24, arcuate lower edge 26 and arcuate sidewalls 28 and 30. The arcuate nature of the upper edge 24, lower edge 26, and sidewalls 28 and 30 provide the support frame 20 with a cavity having a thickness "T" which by way of example can be two to three inches. The cavity 32 of support frame 20 is hollow thereby providing an open space to accommodate fixtures within the cavity 32 of support frame 20.

The support frame 20 supports within it the conventional speaker elements of a tweeter 40 and a woofer 50. The tweeter 40 is a small loudspeaker responsive only to the higher acoustic frequencies and reproducing sound of high pitch. Due to its small size, the tweeter 40 be housed entirely within the depth of the cavity 32 of support frame 20. Support frame 20 has a first opening 21 which extends through the entire depth "D" of panel 22. The tweeter 40 is positioned so that its front 42 is affixed to the wall 22 so that grill 44 of tweeter 40 extends out of the front face 19 of panel 22. The electronic components 46 which are positioned behind the front 42 of tweeter 40 are sufficiently compact such that they can be entirely housed within the cavity 32 of support frame 20, as illustrated in FIG. 3. Since is it not necessary to remove the tweeter for installation purposes, the tweeter can be permanently affixed to the support frame panel 22 by adhesive means. Alternatively, it may be screwed or otherwise removably affixed to the back of support frame 20 so that it can be removed and repaired or replaced if necessary.

The woofer 50 is a loudspeaker responsive only to the lower acoustic frequencies, and used for reproducing sounds of low pitch. The woofer 50 is substantially larger than the tweeter 40. The support frame 20 has a second opening 23 which extends through the entire depth "D" of panel 22. The woofer 50 is positioned so that its front 52 is affixed to the rear 18 of panel 22 so that grill 54 of woofer 50 extends out of the front face 19 of panel 22. Since it is preferable to remove the woofer to measure and draw the opening to be drilled in the structure 100, the woofer 50 can be removably affixed to panel 22 by means such as screws 51 and 53. The threads of each screw are screwed into a respective receiving stub such as 55 illustrated in FIG. 4, which receiving stub is attached and integral with panel 22. The electronic components 56 which are positioned behind the front 52 of woofer 50 are substantially larger than the electronic components 46 of tweeter 40, and therefore the electronic components 56 extend well beyond the thickness "T" of cavity 32 of support frame 20. As further illustrated in FIGS. 2 and 3, a magnet 60 is attached behind the electronic components 56 of woofer 50. The tweeter 40 and woofer 50 are connected by wires 62 and 64. Therefore, the only portion of the assembly which does not lie within the support frame 20 are the electronic components 56 of woofer 50, the magnet 60 attached to the electronic components 56 and wires 62 and 64.

The major significant advantage of the present invention wall mounted speaker assembly 10 is that it can be mounted to the wall 100 of a structure with only the requirement of creating one major opening in wall 100 which is sufficient to permit the electronic components 56 of woofer 50 and the associated magnet 60 to extend through the wall 100. Therefore, with the opening created and attaching means used to affix the support frame 20 to the wall 100, the entire wall mounted speaker assembly 10 can be very quickly and easily installed and mounted on the wall. It will be appreciated that the attaching means illustrated herein is only one of several standard types of attaching means which can be used to affix the support frame 20 to the wall 100.

Support frame 20 comprises two attaching means openings 25 and 27 which extend through the entire depth "D" of support frame panel 22. In the preferred embodiment, the openings 25 and 27 are circular and are of sufficient diameter to accommodate the thickness of a bolt. In operation, the home owner or installer first measures the locations of attaching means openings 25 and 27 and the large opening 23 for woofer 50 so that appropriate openings or holes can be drilled in wall 100 which customarily is made of dry wall or sheetrock. A matching opening 110 is drilled in wall 100 to be aligned with attaching means opening 25 in support frame 20. It will be appreciated that a corresponding comparable opening is drilled in wall 100 to be aligned with attaching means opening 27 in support frame 20. A large opening 120 is drilled in wall 100 which is of sufficient size to permit the electronic components 56 of woofer 50 and the attached magnet 60 to extend through the entire thickness "M" of wall 100 and to clear the sides of the opening 120 so that any vibration of the woofer 50 will not be transmitted to the panel 100. Although not absolutely necessary, it is preferable for the woofer to be removed from the back of the wall 22 by unscrewing the attaching screws 51 and 53 and then drawing the aligned outside circumference of the opening 120 by placing the support frame 20 against the wall 100 and drawing the opening by running a pencil along the circumference of opening 23. Since the electronic components 56 are of smaller diameter than opening 23 in support frame panel 22, it is not necessary to make the opening this large, but an opening of this size will provide for sufficient clearance to assure that vibration from the woofer will not be transmitted to panel 100. After the opening 120 is completed, the woofer 56 can be reattached to support frame wall 22.

The attaching means comprises a metal support plate 70 positioned adjacent the rear surface 102 of wall 100 behind opening 110 and the second opening corresponding to attaching means opening 27. The support plate 70 can be inserted through opening 120 in wall. Support plate 70 further comprises a pair of openings 72 and 74 also aligned with opening 110 and the other opening in wall 100. A first threaded bolt 80 extends through opening 72 in support plate 70 and a nut 86 anchors first bolt 80 to wall 100 such that the head 82 of bolt 80 rests against support plate 70 which in turn rests against the rear surface 102 of wall 100. Similarly, a second bolt having head 84 is attached through a second nut so that the two bolts serve as secure attaching means at spaced apart locations. The woofer 50 is then fitted through the opening 120 so that its electronic components 56 and magnet 60 extend through opening 120 and so the front portions of the two threaded bolts are fit through corresponding attach means openings 25 and 27 in support frame 20. A third nut 31 (which may be a decorative nut) is threaded onto bolt 110 and rests against the front face 19 of support frame 20. Similarly, a fourth nut 33 (which may be a decorative nut) is threaded onto the other bolt and also rests against the front face 19 of support frame 20.

Therefore, through the present invention, the entirely support frame 20 and speaker assembly including the tweeter 40 and woofer 50 can be very quickly and easily attached to the dry wall, sheetrock, or other material of wall 100 and rest adjacent the front surface 104 of wall 100 without requiring a special frame to be built and attached to the framing beams of the structure.

The support frame member 20 and its frame panel 22 can be made of any suitable material, such as metal or plastic. In its preferred orientation, the frame panel 22 is generally rectangular as shown, but any other shape such as oval, square, etc. is within the spirit and scope of the present invention. The frame panel 22 is also preferably generally flat, but non-flat walls are also within the spirit and scope of the present invention.

Therefore, the present invention is defined as a wall mounted speaker assembly, wherein a first opening and a spaced apart second opening are created in the structure wall and a third opening is created in the structure wall to permit a portion of a woofer to extend through the third opening, the structure wall having a front surface and a rear surface, the wall mounted speaker assembly comprising: (a) a frame support member including a generally flat panel having a front surface and a rear surface and including an arcuate upper edge, an arcuate lower edge, and a pair of arcuate sidewalls which form the edges of a cavity located immediately behind the rear surface of the generally flat panel; (b) a first opening in said generally flat wall to receive a tweeter whose dimensions permit the tweeter to be contained within said cavity; (c) a second opening in said generally flat panel spaced apart from said first opening, and sized to receive a woofer whose dimensions cause a portion of the woofer to extend out of said cavity; (d) a first attaching means opening and a spaced apart second attaching means opening in said generally flat panel; (e) the first opening in the wall aligned with said first attaching means opening, the second opening in the structure wall aligned with said second attaching means opening, and the third opening in the wall aligned with said second opening in said generally flat panel of said frame support member; (f) a support plate having a first opening aligned with the first opening in the wall and a spaced apart second opening aligned with the second opening in the wall, and positioned adjacent the rear surface of the wall; (g) a first threaded bolt extending through the first opening in the support plate, through the first opening in the wall and fastened to the wall with a first nut threaded on the first bolt and resting adjacent the front surface of the wall; (h) a second threaded bolt extending through the second opening in the support plate, through the second opening in the wall and fastened to the structure wall with a second nut threaded on the second bolt and rest adjacent the front surface of the wall; and (i) said frame support member mounted in front of the front surface of said wall by extending said first threaded bolt through said first attaching means opening and fastening the frame support member with a third nut threaded onto said first threaded bolt and extending said second threaded bolt through said second attaching means opening and fastening the frame support member with a fourth nut threaded onto said second threaded bolt, and causing the portion of the woofer which extends out of said cavity to extend through said third opening in said structure wall.

Defined more broadly, the present invention is a wall mounted speaker assembly, the wall having a front surface, the wall mounted speaker assembly comprising: (a) a frame support member including a panel having a front surface and a rear surface and including an arcuate upper edge, an arcuate lower edge, and a pair of arcuate sidewalls which form the edges of a cavity located immediately behind the rear surface of the frame panel; (b) a first opening in the frame panel to receive a tweeter whose dimensions permit the tweeter to be contained ,within said cavity; (c) a second opening in the frame panel spaced apart from said first opening, and sized to receive a woofer whose dimensions cause a portion of the woofer to extend out of said cavity; and (d) means for attaching said frame support member to said wall such that the frame support member is positioned adjacent the front surface of the wall; (e) whereby an opening is created in the wall to permit the portion of the woofer which extends out of said cavity to extend through the opening in the wall and said frame support member is attached to said wall by said attaching means.

Defined even more broadly, the present invention is a wall mounted speaker assembly, the wall having a front surface, the wall mounted speaker assembly comprising: (a) a frame support member including a panel having a front surface and a rear surface and including a cavity located immediately behind the rear surface of the frame panel; (b) a first opening in the frame wall to receive a tweeter whose dimensions permit the tweeter to be contained within said cavity: (c) a second opening in the frame wall spaced apart from said first opening, and sized to receive a woofer whose dimensions cause a portion of the woofer to extend out of said cavity; and (d) means for attaching said frame support member to said wall such that the frame support member is positioned adjacent the front surface of the wall; (e) whereby an opening is created in the wall to permit the portion of the woofer which extends out of said cavity to extend through the opening in the wall and said frame support member is attached to said wall by said attaching means.

Of course the present invention is not intended to be restricted to any particular form or arrangement, or any specific embodiment disclosed herein, or any specific use, since the same may be modified in various particulars or relations without departing from the spirit or scope of the claimed invention hereinabove shown and described of which the apparatus is intended only for illustration and for disclosure of an operative embodiment and not to show all of the various forms of modification in which the invention might be embodied or operated.

The invention has been described in considerable detail in order to comply with the patent laws by providing full public disclosure of at least one of its forms. However, such detailed description is not intended in any way to limit the broad features or principles of the invention or the scope of patent monopoly to be granted.

What is claimed is:

1. A speaker assembly to be mounted onto a wall, wherein the wall has a front surface and a rear surface, and a first wall opening and a spaced apart second wall opening are created in the wall and a third wall opening is created in the wall to permit a portion of a woofer to extend through the third wall opening, the wall mounted speaker assembly comprising:

a. a frame support member including a generally flat panel having a front surface and a rear surface and including an arcuate upper edge, an arcuate lower edge, and a pair of arcuate sidewalls which dorm four edges of a cavity located immediately behind the rear surface of the generally flat panel;

b. a first speaker opening in said generally flat panel of said frame support member to receive a tweeter whose dimensions permit the tweeter to be contained within said cavity of said frame support member;

c. a second speaker opening in said generally flat panel of said frame support member spaced apart from said first speaker opening, and sized to receive a woofer whose dimensions cause a portion of the woofer to extend out of said cavity of said frame support member;

d. a first attaching means opening and a second attaching means opening in said generally flat panel of said frame support member;

e. said first and second attaching means openings and said second speaker opening in said generally flat panel of said frame support member being spaced apart, such that the first wall opening in the wall is aligned with said first attaching means opening in said generally flat panel of said frame support member, the second wall opening in the wall is aligned with said second attaching means opening in said generally flat panel of said frame support member, and the third wall opening in the wall is aligned with said second speaker opening in said generally flat panel of said frame support member;

f. a support plate having a first bolt opening aligned with the first wall opening in the wall and a spaced apart second bolt opening aligned with the second wall opening in the wall, and positioned adjacent the rear surface of the wall;

g. a first threaded bolt extending through the first bolt opening in said support plate, through the first wall opening in the wall and fastened to the wall with a first nut threaded on the first bolt and resting adjacent the front surface of the wall;

h. a second threaded bolt extending through the second bolt opening in said support plate, through the second wall opening in the wall and fastened to the wall with a second nut threaded on the second bolt and resting adjacent the front surface of the wall; and i. said frame support member mounted in front of the front surface of the wall by extending said first threaded bolt through said first attaching means opening in said generally flat panel of said frame support member and fastening said frame support member with a third nut threaded on said first threaded bolt, and extending said second threaded bolt through said second attaching mean opening in said generally flat panel of said frame support member and fastening said frame support member with a fourth nut threaded on said second threaded bolt, and causing the portion of said woofer which extends out of said cavity of said frame support member to extend through the third wall opening in the wall.

2. A wall mounted speaker assembly in accordance with claim 1, wherein said tweeter is permanently affixed to said generally flat panel of said frame support member.

3. A wall mounted speaker assembly in accordance with claim 1, wherein said woofer is removably affixed to said generally flat panel of said frame support member.

4. A wall mounted speaker assembly in accordance with claim 1, wherein said third nut and said fourth nut are decorative nuts.

5. A wall mounted speaker assembly in accordance with claim 1, wherein said generally flat panel of said support member is made of plastic.

6. A speaker assembly to be mounted onto a wall, wherein the wall has a front surface, the wall mounted speaker assembly comprising:

a. a frame support member including a panel having a front surface and a rear surface and including an arcuate upper edge, an arcuate lower edge, and a pair of arcuate sidewalls which form four edges of a cavity located immediately behind the rear surface of the panel;

b. a first opening in said panel of said frame support member to receive a tweeter whose dimensions permit the tweeter to be contained within said cavity of said frame support member;

c. a second opening in said panel of said frame support member spaced apart from said first opening, and sized to receive a woofer whose dimensions cause a portion of the woofer to extend out of said cavity of said frame support member; and d. means for attaching said frame support member to the wall such that said frame support member is positioned adjacent the front surface of the wall;

e. whereby an opening is created in the wall to permit the portion of said woofer which extends out of said cavity of said frame support member to extend through the opening in the wall, and said frame support member is attached to the wall by said attaching means.

7. A wall mounted speaker assembly in accordance with claim 6, wherein said means for attaching said frame support member to the wall comprises at least one threaded bolt member anchored to the wall and further extending through a corresponding opening in said panel of said frame support member and fastened thereon with a nut threaded on the at least one threaded bolt member.

8. A wall mounted speaker assembly in accordance with claim 7, wherein said at least one threaded bolt is anchored to the wall by creating an opening in the wall, placing a support plate having an opening aligned with the opening created in the wall against a rear surface of the wall, placing the at least one threaded bolt through the opening in the support plate and through the opening in the wall, and securing the at least one threaded bolt with a nut threaded on the at least one threaded bolt and resting adjacent the front surface of the wall.

9. A wall mounted speaker assembly in accordance with claim 6, wherein said tweeter is permanently affixed to said panel of said frame support member.

10. A wall mounted speaker assembly in accordance with claim 6, wherein said woofer is removably affixed to said panel of said frame support member.

11. A wall mounted speaker assembly in accordance with claim 7, wherein said nut is a decorative nut.

12. A wall mounted speaker assembly in accordance with claim 6, wherein said panel of said support member is made of plastic.

13. A speaker assembly to be mounted onto a wall, wherein the wall has a front surface, the wall mounted speaker assembly comprising:

a. a frame support member including a panel having a front surface and a rear surface and including a cavity located immediately behind the rear surface of the panel;

b. a first opening in said panel of said frame support member to receive a tweeter whose dimensions permit the tweeter to be contained within said cavity of said frame support member;

c. a second opening in said panel of said frame support member spaced apart from said first opening, and sized to receive a woofer whose dimensions cause a portion of the woofer to extend out of said cavity of said frame support member; and d. means for attaching said frame support member to the wall such that said frame support member is positioned adjacent the front surface of the wall;

e. whereby an opening is created in the wall to permit the portion of said woofer which extends out of said cavity of said frame support member to extend through the opening in the wall, and said frame support member is attached to the wall by said attaching means.

14. A wall mounted speaker assembly in accordance with claim 13, wherein said means for attaching said frame support member to the wall comprises at least one threaded bolt member anchored to the wall and further extending through a corresponding opening in said panel of said frame support member and fastened thereon with a nut threaded on the at least one threaded bolt member.

15. A wall mounted speaker assembly in accordance with claim 14, wherein said at least one threaded bolt is anchored to the wall by creating an opening in the wall, placing a support plate having an opening aligned with the opening created in the wall against a rear surface of the wall, placing the at least one threaded bolt through the opening in the support plate and through the opening in the wall, and securing the at least one threaded bolt with a nut threaded on the at least one threaded bolt and resting adjacent the front surface of the wall.

16. A wall mounted speaker assembly in accordance with claim 13, wherein said tweeter is permanently affixed to said panel of said frame support member.

17. A wall mounted speaker assembly in accordance with claim 13, wherein said woofer is removably affixed to said panel of said frame support member.

18. A wall mounted speaker assembly in accordance with claim 14, wherein said nut is a decorative nut.

19. A wall mounted speaker assembly in accordance with claim 6, wherein said panel of said support member is made of plastic.

* * * * *